(12) United States Patent
Wu et al.

(10) Patent No.: US 9,343,312 B2
(45) Date of Patent: May 17, 2016

(54) HIGH TEMPERATURE INTERMITTENT ION IMPLANTATION

(71) Applicant: Taiwan Semiconductor Manufacturing Company, Ltd., Hsin-Chu (TW)

(72) Inventors: Hsin-Wei Wu, Hsinchu (TW); Tsun-Jen Chan, Pingzhen (TW); Chun-Feng Nieh, Hsinchu (TW); Hsing-Jui Lee, Hsinchu (TW); Yu-Chi Fu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/341,251

(22) Filed: Jul. 25, 2014

(65) Prior Publication Data

US 2016/0027646 A1   Jan. 28, 2016

(51) Int. Cl.
*H01L 21/265* (2006.01)
*H01L 21/324* (2006.01)
*H01L 21/02* (2006.01)
*H01J 37/317* (2006.01)

(52) U.S. Cl.
CPC .......... *H01L 21/265* (2013.01); *H01J 37/3171* (2013.01); *H01L 21/02664* (2013.01); *H01L 21/324* (2013.01)

(58) Field of Classification Search
CPC ............ H01L 21/67213; H01L 21/324; H01L 21/265; H01L 21/02664; H01L 21/0445; H01L 21/02694
See application file for complete search history.

(56) References Cited

U.S. PATENT DOCUMENTS

| H1637 H * | 3/1997 | Offord et al. ............... 438/311 |
| 8,673,753 B1 * | 3/2014 | Wan ........................... 438/514 |
| 2008/0042078 A1 * | 2/2008 | England et al. .......... 250/492.21 |
| 2009/0047768 A1 * | 2/2009 | Jain ........................... 438/306 |
| 2009/0140717 A1 * | 6/2009 | Rubin et al. ............... 324/71.3 |
| 2009/0224284 A1 * | 9/2009 | Nemoto ..................... 257/109 |
| 2009/0308439 A1 * | 12/2009 | Adibi et al. ............... 136/255 |
| 2011/0260047 A1 * | 10/2011 | Lee ........................... 250/282 |
| 2012/0205727 A1 * | 8/2012 | Kanakasabapathy et al. .......................... 257/288 |
| 2013/0196492 A1 * | 8/2013 | Ninomiya et al. .......... 438/527 |
| 2013/0325024 A1 | 12/2013 | Nissan et al. |
| 2014/0065737 A1 * | 3/2014 | Ninomiya et al. ........... 438/17 |
| 2015/0104885 A1 * | 4/2015 | Chang ............................ 438/5 |
| 2015/0155172 A1 * | 6/2015 | Breil ........................... 438/530 |

* cited by examiner

*Primary Examiner* — Latanya N Crawford
(74) *Attorney, Agent, or Firm* — Haynes and Boone, LLP

(57) ABSTRACT

A method includes providing a semiconductor substrate, and performing an ion implantation process to a surface of the substrate. The ion implantation process includes intermittently applying an ion beam to the surface, and while applying the ion beam, applying a heating process with a heating temperature above a threshold level.

20 Claims, 6 Drawing Sheets

HIGH TEMPERATURE INTERMITTENT ION IMPLANTATION

BACKGROUND

Ion implantation is a process that is used in semiconductor fabrication processes. In general, ion implantation is used to dope a semiconductor material to form an active region such as a source or drain region. The semiconductor material is generally a crystal structure before application of the ion implantation process. A crystal structure is a solid having atoms or molecules in an ordered pattern. The ion implantation process typically damages the semiconductor crystal structure to form an amorphous structure, meaning that the molecules are no longer in an ordered pattern. Thus, an annealing process involving a high temperature is often applied to the damaged crystal to cause the structure to recrystallize. The recrystallization process can often leave defects in the recrystallized semiconductor structure. Thus, it is desirable to have methods of performing the ion implantation process without leaving such defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
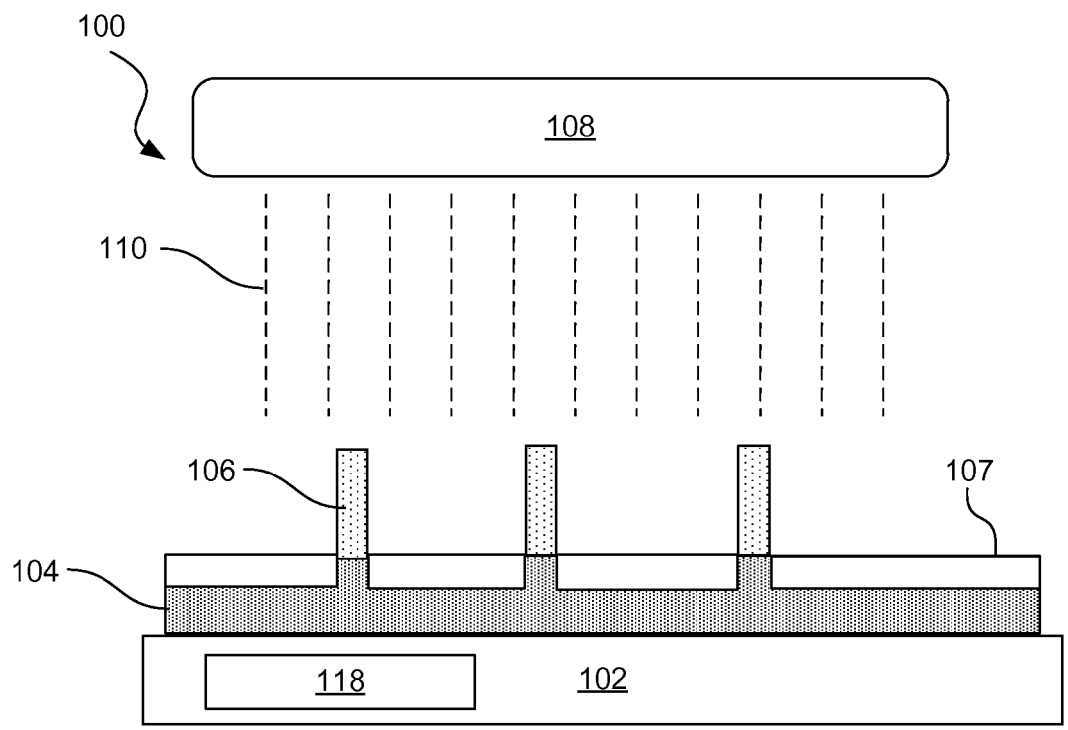
FIG. 1 is a diagram showing an illustrative semiconductor fabrication system capable of performing intermittent ion implantation, according to one example of principles described herein.
Figure 1:
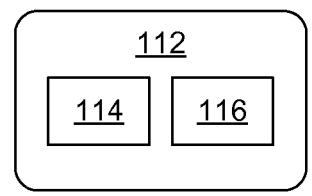

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to have methods of performing the ion implantation process without leaving defects. Such defects may be more pronounced on fin structures. A fin structure is a narrow feature that has a fin-like shape. Fin structures may be grown epitaxially onto a semiconductor substrate. The fin structure itself is made of a semiconductor material. An ion implantation process is typically used to dope the fin structure as desired. But, as described above, the ion implantation damages the crystal structure of the fin structure. Thus, the fin structure becomes amorphous, meaning that it no longer has a periodic structure. The annealing process causes the fin structure to recrystallize. But, as the molecules re-orient themselves, defects can form. Particularly, due to the shape of the fin structure, twin-like defects, which may be described as dislocation defects pointing up diagonally towards the center of the fin structure are formed.

According to principles described herein, the ion implantation process is performed under high temperature conditions. Additionally, the ion beam is applied intermittently. Thus, between successive application of the ion beam, and due to the high temperatures being applied, the fin structure will be able to recrystallize while the implant process is being applied. This will allow point defects resulting from the ion implantation to migrate towards the top of the device to an amorphous portion. A final temperature spike to finish the annealing process is then applied. Performing such an ion implantation process substantially reduces the defects in the fin structure. Having fewer defects allows the fin structure to perform its functions more efficiently.

FIG. 1 is a diagram showing an illustrative semiconductor fabrication system 100 capable of performing intermittent ion implantation. According to the present example, the system 100 includes a platen 102 designed to hold a wafer 104. The platen includes a heating source 118 used to heat the wafer 104. The system also includes an ion source 108 for generating and projecting an ion beam 110 onto a portion of the wafer 104, such as features 106 formed on the wafer 104. The system 100 may be controlled by a control module 112 that includes a processor 114 and a memory 116.

In some embodiments, the platen 102 is controllable to move the wafer 104 so that the wafer 104 is processed by the ion beam in a suitable mode, such as in a scan mode. In other embodiments, the platen 102 (or the source 108) is controllable to be tilted relatively such that the ion beam 108 is directed to the wafer 104 with a tilt angle or is directed away from the wafer 104.

The platen 102 is used to support the wafer 104 during the ion implantation process. The platen 102 may secure the wafer 104 using a variety of methods. For example, the platen 104 may use a vacuum to secure the wafer 104 to the platen 102. In some examples, the platen 102 uses electrostatic forces to secure the wafer 104 to the platen 102. As will be described in further detail below, the platen 102 is movable with respect to the ion beam 110.

The heating source 118 is used to heat the platen 102, and thus the wafer 104, during an ion implantation process and during an annealing process in some embodiment. In one example, the heating source 118 may include a number of heating elements positioned throughout the platen 102. When energy is supplied to the heating elements, they may be capable of heating the platen to a temperature within a range of about 150 to 800 degrees Celsius. In some example, the heating elements may heat the wafer 104 to a temperature that is greater than 900 or 950 degrees Celsius. Other mechanisms for heating the wafer 104 to such high temperatures may be used in accordance with principles described herein.

The wafer 104 may be a standard semiconductor wafer. For example, the wafer may be approximately 300 millimeters in diameter and less than one millimeter thick. The wafer 104 may be made of a semiconductor material such as silicon. The wafer may have features such as fin structures 106 that were formed in previous processes. For example, to form such fin structures 106, Shallow Trench Isolation (STI) features 107 may be formed on the surface of the substrate, by a procedure that includes lithography to form a patterned material layer, etch to recess the substrate to form trenches, filling the trenches with one or more dielectric material, and a chemical mechanical polishing (CMP) to remove excessive dielectric material. Then, in one example, the STI regions 107 may be recessed to leave the remaining fin structures 106. In some examples, an epitaxy process may be used to grow the fin structures where the semiconductor substrate is exposed between the STI regions 107.

Epitaxy is a process that involves forming a crystalline structure on top a crystalline substrate such that there is registry between the two crystal structures. An epitaxy process to form semiconductor features typically uses vapor-phase epitaxy. Vapor-phase epitaxy involves a chemical reaction between silicon tetrachloride and hydrogen at a high temperature in some embodiments.

Fin structures may be used for a wide variety of purposes. In one example, a fin structure provides a three dimensional (3D) active region and is used to form source and drain, and a channel in a field effect transistor device. Such a transistor device is sometimes referred to as a FinFET (Fin Field Effect Transistor) device. In such a device, a gate structure is formed perpendicular to the fin structure. The source and drain regions are then formed in the fin structure on both sides of the gate structure. The channel, which is where current flows between the source and drain regions based on a bias applied to the gate structure, is within the fin structure underneath the gate structure. While only a few fin features 106 are illustrated in FIG. 1, it is understood that principles described herein are applicable to one or multiple fin features formed on the wafer 104.

The source and drain regions of a Metal Oxide Semiconductor Field Effect Transistor (MOSFET) device such as a finFET typically include a Lightly Doped Drain (LDD) portion (or LDD regions) and a higher doped portion (or higher doped regions). The lightly doped portion has a smaller doping concentration than the higher doped portion. In general, the portion closer to where a conductive contact is to connect with the source or drain region has a higher doping profile than the rest of the source or drain region, which comprises the LDD portion.

Forming both the LDD regions and the higher doped regions can be done using ion implantation. Ion implantation involves the use of ions that are accelerated in an electrical field and impacted into a semiconductor feature, such as the fin structure 106. For example, dopants such as boron, phosphorous, or arsenic can be implanted into a semiconductor. Each dopant atom may create a charge carrier in the semiconductor. A charge carrier can be a hole, created by a p-type dopant, or an electron, created by an n-type dopant. A doped semiconductor material has different electrically conductive properties.

The ions used by an ion implantation process are produced by an ion source 108. The ion source 108 produces the charged particles which are then directed into an ion beam 110 using, such as magnetic fields. Because, the ion beam 110 involves the flow of charged particles, the ion beam forms an electric current, which can be measured in amperes. The ion beam can be turned on and off in order to be intermittently applied.

The fabrication system 100 can be managed by a control module 112. The control module 112 includes a processor 114 and a memory. The control module 112 may be responsible for controlling the various components of the fabrication system 100. For example, the control module 112 may be responsible for engaging the heating module 118 at the appropriate times during an ion implantation process. Additionally, the control module 112 may be responsible for turning the ion beam on 110 and off, or moving the platen 102 with respect to the ion beam 110. The control module 112 further coordinates the various components (such as the heating module 118, the platen 102 and the source 108) to implement a method of making an integrated circuit, which is described later.

The memory 116 within the control module may include volatile memory such as processor caches and Random Access Memory (RAM). Volatile memory loses its contents when the power supply is interrupted. But, volatile memory is able to be accessed more quickly than non-volatile memory. The memory 116 may also include non-volatile memory such as solid state drives, hard disk drives, and other forms of memory that is able to maintain its contents with or without power.

The memory 116 may store software (i.e., machine readable instructions) and data. The software may include machine readable instructions for controlling the ion implantation process. For example, the software may control the platen 102 and/or the ion beam 110 such that the ion beam 110 is intermittently applied to the feature 106.

Figure 2:
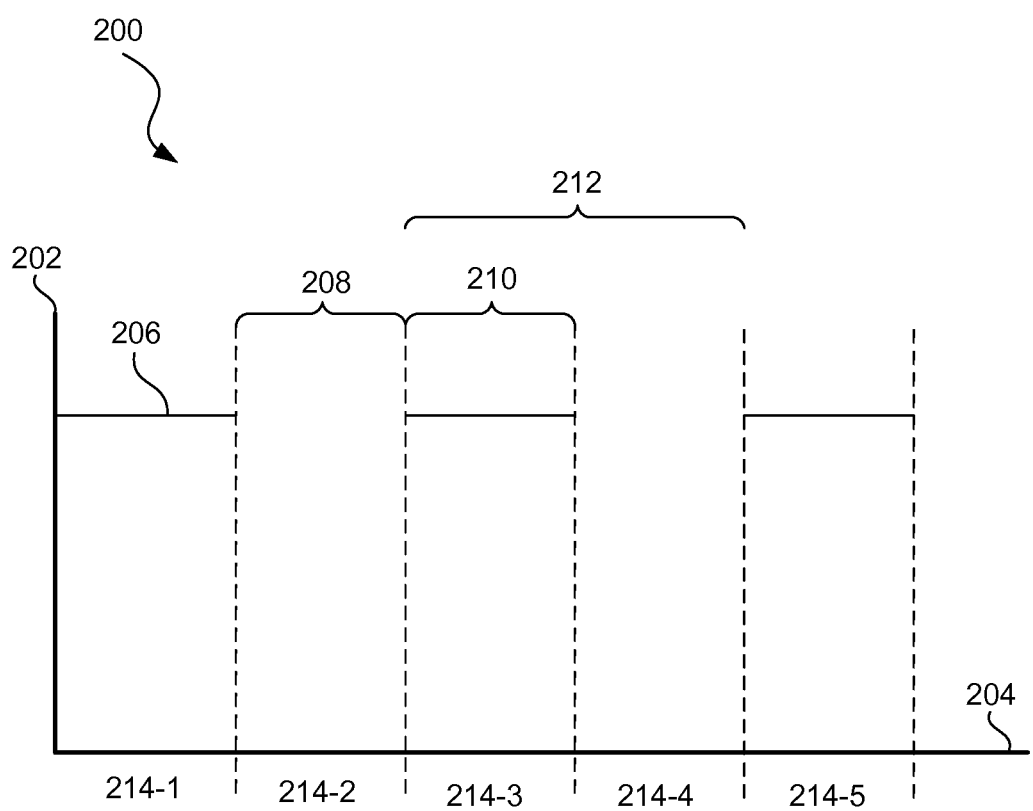
FIG. 2 is a graph showing illustrative timing for applying an ion beam during an ion implantation process, according to one example of principles described herein.

FIG. 2 is a graph showing illustrative timing for applying an ion beam during an ion implantation process. According to the present example, the vertical axis 202 represents ion beam current. Additionally, the horizontal axis 204 represents time. The graph 200 illustrates the beam current level 206 at five different time ranges, specifically, time range 214-1, 214-2, 214-3, 214-4, and 214-5.

The beam current level 206 represents the ion beam current at a particular time range 214. The beam current level 206 may be within a range of about 6 to 13 milliamps. In the present example, the ion beam current is present at time ranges 214-1, 214-3, and 214-5. These time ranges will be referred to as ON time ranges. But, the ion beam is not present at time ranges 214-2 and 214-4. These time ranges will be referred to as OFF time ranges. This intermittent pattern may be performed in a variety of ways. In one example, the ion beam is simply turned on and off. This may result in some ramp up and ramp down currents. In one example, the feature 106 to which the ion beam is being applied is moved with respect to the ion beam. For example, the platen 102 may be configured to move the wafer 104, and thus the feature 106 so that it passes the ion beam 110. Thus, time ranges 214-1, 214-3 and 214-5 correspond to when the feature is beneath the ion beam 110. Time ranges 214-2 and 214-4 correspond to when the feature 106 is not beneath the ion beam 110.

The length 210 of an ON time range 214 such as time range 214-3 may be within a range of about 1 to 8 seconds. In some examples, the total dosage of dopant ions during the time interval may be less than $5 \times 10^{14}/cm^2$. During the ON time ranges, the ion beam projects dopants into the fin structure. The implantation of the ions typically causes point defects. A point defect is a defect that occurs at or around a single lattice point. Thus, the point defect does not extend in a particular dimension.

The length 208 of an OFF time range 214 such as time range 214-2 may be within a range of 2 to 5 seconds. In one example, the length 208 of the OFF time range is greater than 3 seconds. As will be explained in further detail below, the OFF time ranges 214 allow the point defects to migrate toward an amorphous region of the fin structure. The total period 212 represents a single cycle that includes an ON time range and an OFF time range. In some examples, the length 208 of the OFF time ranges may be different than the length of the ON time ranges.

Figure 3:
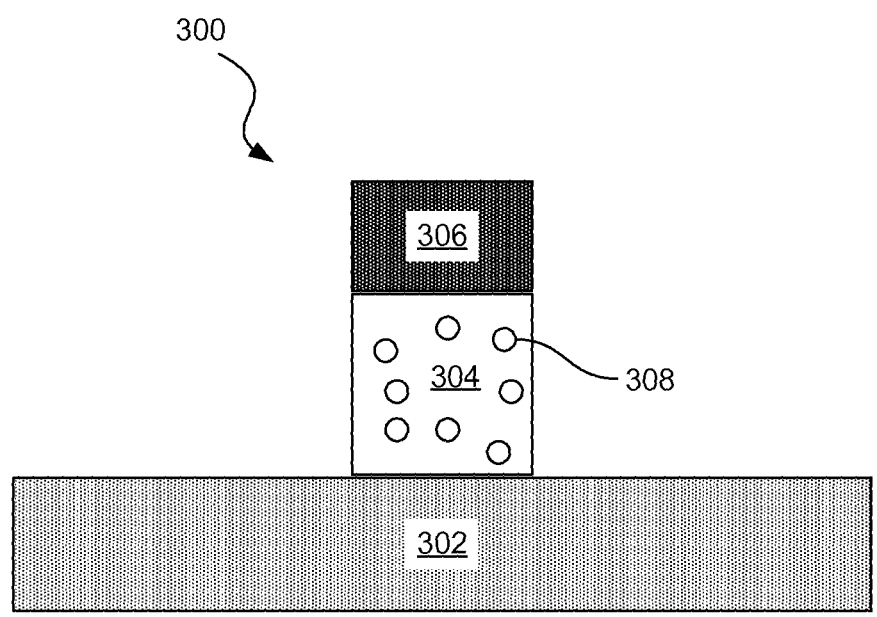
FIG. 3 is a diagram showing an illustrative fin structure, according to one example of principles described herein.

FIG. 3 is a diagram showing an illustrative fin structure 300 on a substrate 302. As described above, a fin structure 300 may be grown onto a substrate 302 through an epitaxial process. During an implantation process, the crystal structure becomes damaged, and thus the fin structure becomes amorphous. A thermal annealing process can be used to recrystallize the amorphous structure. Specifically, the high energy resulting from the high temperature causes the molecules to reorient themselves so that they form an order. Specifically, the dopant atoms diffuse into the crystal structure and become charge carriers.

During the thermal annealing process, the amorphous fin structure begins to recrystallize. FIG. 3 illustrates a recrystallized region 304 of the fin structure 300 and an amorphous 306 region. The high temperature applied during the ion implantation process will allow the fin structure to begin recrystallization during the implantation process. Additionally, by applying the ion implantation intermittently as described above, the point defects 308 will have time to migrate towards the amorphous layer. Eventually, as the ion implantation process finishes, the amorphous layer 306 becomes smaller and smaller until the entire fin structure 300 recrystallizes.

Figure 4A:
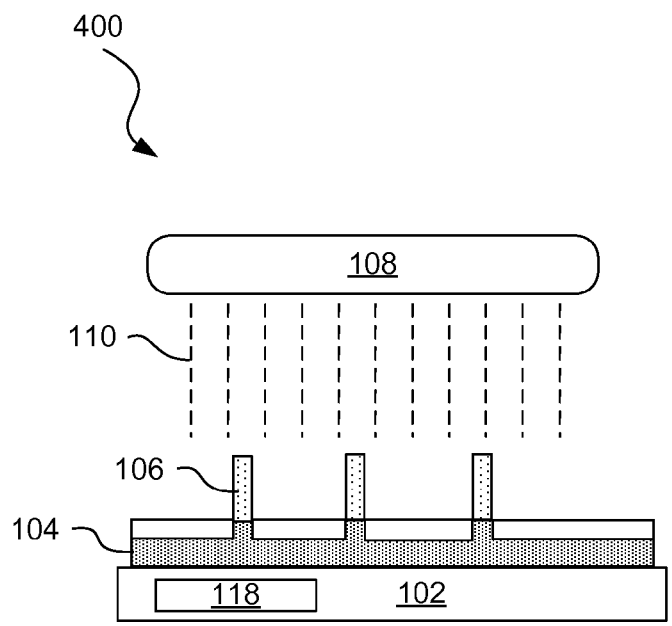
FIGS. 4A and 4B are diagrams showing illustrative movement of a platen to cause intermittent ion beam application, according to one example of principles described herein.
Figure 4B:
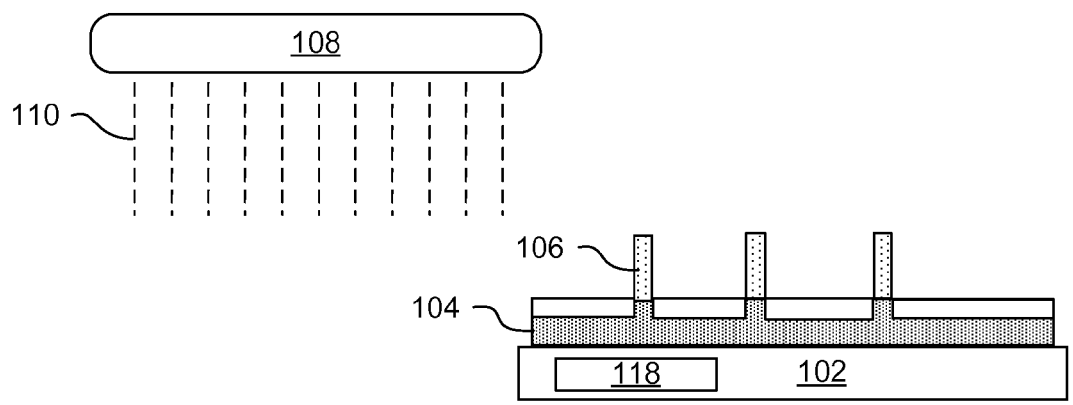

FIGS. 4A and 4B are diagrams showing illustrative movement of a platen to cause intermittent ion beam application. As described above, instead of causing the ion beam to be applied intermittently by turning the ion beam 110 on an off, the ion beam 110 can be applied intermittently by moving the wafer 104 with respect to the ion beam 108 such that the feature 106 moves in and out of the path of the ion beam 110. Thus, the ion beam 110 can maintain a continuous current level through all of the time ranges. This allows the ion beam to be applied intermittently without having the ion beam have to ramp up or ramp down for each ON time range.

FIG. 4A illustrates the platen 102 in a position such that the substrate 104 is in the path of the ion beam 110. Thus, the ion implantation process proceeds when the platen 102 is positioned as such. This position corresponds to the ON time period described above in the text accompanying FIG. 3. Thus, when the platen 102 is in this position, the dopant ions are being impacted into the features 106. Impaction of such dopant ions results in point defects. But, due to the high temperature being applied concurrently with the application of the ion beam, the feature may start to recrystallize. This causes an amorphous region towards the top of the feature 306, and a recrystallized region towards the bottom of the feature 306.

FIG. 4B illustrates the platen 102 in a position such that the substrate 104 is not within the path of the ion beam 110. Such a position corresponds to an OFF time period as described in FIG. 3. When the platen 102 is in such a position, the point defects created by the ion implantation process have some additional time to migrate towards the amorphous layer. As the intermittent ion implantation process continues, the amorphous layer will become smaller, thus, the point defects will eventually disappear with the amorphous layer. This results in a feature with substantially less defects.

The length of the time ranges for when the ion beam is applied or not applied can be controlled by setting the time at which the platen will be in a particular position. For example, to cause an ON time range to have a period of 5 seconds, the platen will move into the position illustrated in FIG. 4A for about 5 seconds. Furthermore, to cause an OFF time range to have a length of 3 seconds, the platen 102 moves into the position illustrated in FIG. 4B for about 3 seconds. The movement of the platen 102 may be managed by the control module 112 described above. The control module 112 may adjust the lengths of the ON time ranges and the OFF time ranges by controlling the platen movement accordingly. The lengths of the ON time ranges and the OFF time ranges may be tuned for a particular type of process. For example, different dopant materials or different semiconductor feature 106 materials may be better suited for particular lengths of the ON time ranges and the OFF time ranges.

FIG. 5 is a diagram showing an illustrative rotation 500 of a rotating mechanism 502 to cause intermittent ion beam application. As described above, instead of causing the ion beam to be applied intermittently by turning the ion beam 110 on an off, the ion beam 110 can be applied intermittently by moving the wafer 104 with respect to the ion beam 108 such that the feature 106 moves in and out of the path of the ion beam 110. Thus, the ion beam 110 can maintain a continuous current level through all of the time ranges. This allows the ion beam to be applied intermittently without having the ion beam have to ramp up or ramp down for each ON time range.

Figure 5A:
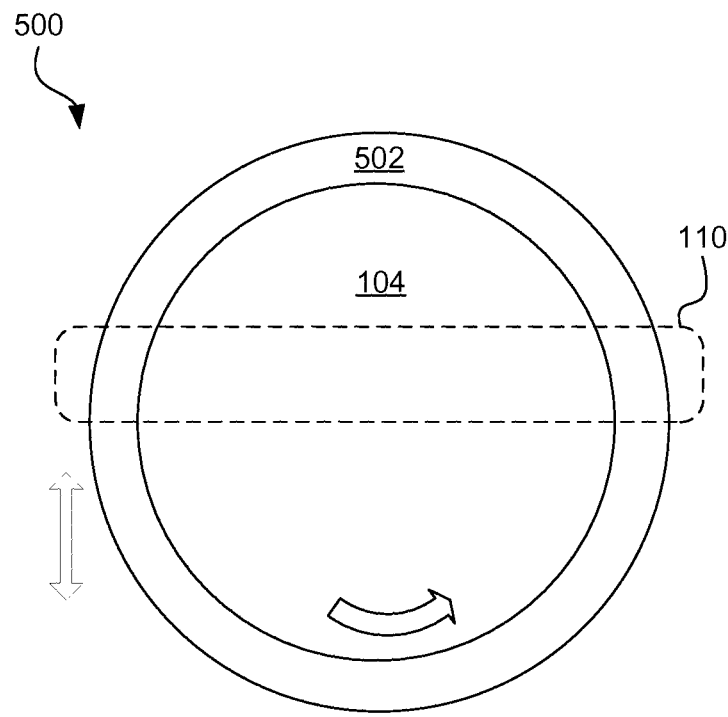
FIGS. 5A-5B are diagrams showing an illustrative top view of a wafer to which an ion beam is intermittently applied, according to one example of principles described herein.
Figure 5B:
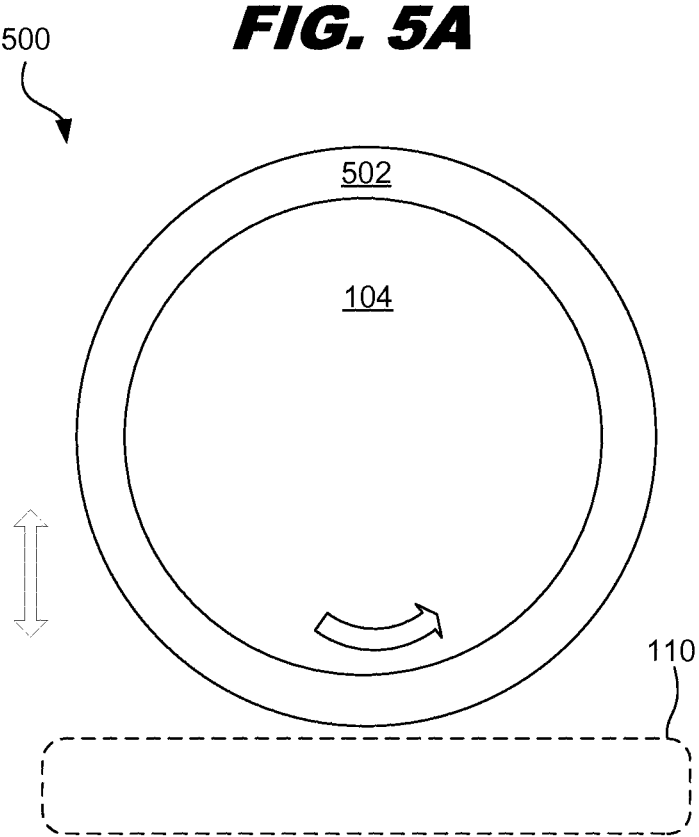

FIGS. 5A-5B are diagrams showing an illustrative top view of a wafer 104 to which an ion beam is intermittently applied. According to the present example, the wafer 104 moves with respect to the ion beam 110 such that the beam scans across the wafer to perform ion implantation. In conventional systems, the ion beam scans across the surface of the wafer but does not leave the surface of the wafer. Rather the wafer moves relative to the ion beam such that the ion beam scans back and forth across the wafer while always being applied to at least some portion of the wafer.

According to principles described herein, to perform the intermittent ion beam application as described above, the ion beam 110 can move relative to the wafer 104 such that the ion beam is completely off the wafer 104 for a period of time. The period of time can be set based on the desired OFF time as described above. FIG. 5A illustrates a point in time at which the wafer 104 is positioned such that the ion beam 110 is over the wafer. FIG. 5B illustrates a point in time at which the wafer 104 is positioned such that the ion beam 110 is not over the wafer 104.

In some examples, the platen 502 may rotate such that the ion beam 110 is scanned at a different angle. For example, each time the ion beam 110 is not over the wafer 104, the platen 502 may rotate the wafer 104. In one example, the wafer 104 is rotated 45 degrees each time the wafer 104 is positioned such that it is not within the path of the ion beam 110. Thus, it will take eight cycles for the wafer to make a full rotation.

Figure 6:
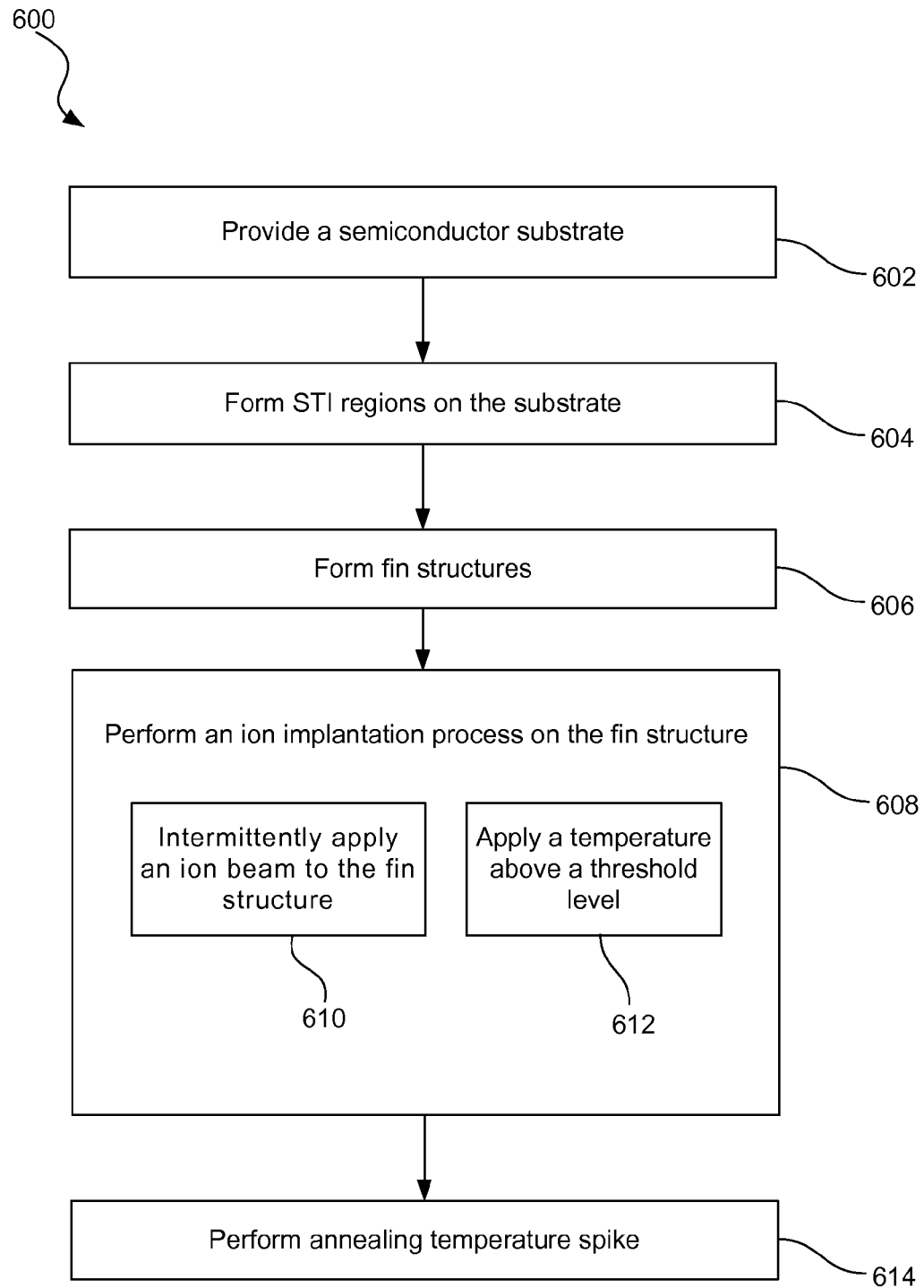
FIG. 6 is a flowchart showing an illustrative method for performing an ion implantation process on a fin structure, according to one example of principles described herein.

FIG. 6 is a flowchart showing an illustrative method for performing an ion implantation process on a fin structure. According to the present example, the method 600 includes a step 602 for providing a semiconductor substrate. The substrate may be made of various types of semiconductor material such as silicon. The semiconductor substrate may have already had various fabrication processes performed thereon. For example, various features may be etched into the surface, and various materials may have been deposed onto the substrate.

The method 600 may further include a step 604 for forming STI regions on the substrate. This may be done by etching a pattern for the STI regions into the substrate. A dielectric material may then be deposited onto the substrate. A Chemical Mechanical Polishing (CMP) process can then be applied to expose the substrate at the non-STI regions.

The method 600 may further include forming gate stacks over the fin structures. In some embodiments, the formation of the gate stacks includes deposition of gate dielectric material and gate electrode material, and patterning the gate materials to form the gate stacks.

The method 600 may further include a step 606 for forming fin structures. The fin structure may be performed through an epitaxial process. As described above, the epitaxial process causes the growth of a semiconductor material onto the surface of a semiconductor material. In one example, the surface of the substrate may have a hard mask layer formed thereon. A pattern may then be formed into the hard mask such that the exposed regions correspond to where the fin structure and other similar features are to be formed with the epitaxial process.

The method 600 further includes a step for performing an ion implantation process 608 on the fin structure. The ion implantation process may be used to form the LDD regions on the fin structure. The ion implantation process of step 606 further includes a step 610 for intermittently applying an ion beam to the fin structure. This is done while the high temperature is being applied. The intermittent application of the ion beam may be done by moving the platen supporting the wafer such that the fin structure moves in and out of the path of a continuous ion beam in some embodiments. The ion beam may have a current within a range of about 6 to 13 milliamps. The time range for which the ion beam is not applied to the fin structure may be greater than 3 seconds. This amount of time gives the point defects enough time to migrate towards the amorphous layer. The time range for which the ion beam is applied may be within a range of about 1 to 8 seconds.

The ion implantation process of step 608 further includes a step 612 for applying a heating process with a heating temperature above a threshold level. This is done while intermittently applying the ion beam. For example, the heating temperature applied may be within a range of about 150 to 800 degrees Celsius. This temperature range allows the damaged crystal structure of the fin structure to start to recrystallize during the ion implantation process. Additionally, the high temperature allows point defects to migrate towards the amorphous layer. When the ion beam is intermittently applied, the heating process is continuously applied. In one example illustrated in FIG. 2, the heating process is applied continuously through the time ranges 2141, 214-2, 214-3, 214-4 and 214-5.

The method 600 further includes a step 614 for performing a spike annealing process. The spike annealing process further activate the implanted dopants. In some examples, a final spike annealing process is applied sometime after the intermittent application of the ion beam is done. In one example, the spike annealing process may also be done after the higher doped regions used for the source and drain regions are formed on the fin structure. In the present embodiment, the spiking annealing process has an annealing temperature higher than that heating temperature of the heating process, and the spike annealing process has a duration of time less than the duration of the heating process (or less than the duration of the intermittent ion implantation in other words). The spike annealing process may have a temperature that is greater than 950 degrees Celsius. In some embodiments, the step 608 is implemented in the semiconductor fabrication system 100 while the spike annealing process is implemented in a spike annealing system.

By both applying the high temperature, and intermittently applying the ion beam, a fin structure having substantially fewer defects can be formed. Having fewer defects allows for better performance of the fin structure. Specifically, the fin structure will be able to conduct electrical current as desired more efficiently.

According to one example, a method includes providing a semiconductor substrate, and performing an ion implantation process to a surface of the substrate, the ion implantation process comprising: intermittently applying an ion beam to the surface, and while applying the ion beam, applying a heating process with a heating temperature above a threshold level.

A method includes providing a semiconductor substrate, epitaxially growing semiconductor structures onto the semiconductor substrate, forming lightly doped regions within the semiconductor structures by: intermittently applying an ion beam to the substrate, while intermittently applying the ion beam, heating the substrate to be within a specified temperature range, and after intermittently applying the ion beam, applying a spike annealing process to the substrate.

A semiconductor fabrication system includes a platen for securing a substrate, an ion source configured to project an ion beam, a heating source to heat the substrate to a temperature greater than a threshold temperature, and a control system configured to: intermittently apply the ion beam to a surface of the substrate and while applying the ion beam, use the heating source to apply a heating process with a heating temperature above the threshold temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a semiconductor substrate; and
performing an ion implantation process to a surface of the substrate, the ion implantation process comprising:
applying an ion beam to the surface during a first time range;
not applying the ion beam to the surface during a second time range, the second time range following the first time range;

applying the ion beam to the surface during a third time range, the third time range following the second time range;

not applying the ion beam to the surface during a fourth time range, the fourth time range following the third time range;

while performing the ion implantation process, continuously applying a heating process with a heating temperature above a threshold level; and after performing the ion implantation process, performing an annealing spike process to the substrate, wherein the annealing spike process includes applying an annealing temperature that is higher than the heating temperature, and wherein a time duration of the annealing spike process is less than a time duration of the heating process.

2. The method of claim 1, wherein the ion implantation processes comprises moving the substrate in and out of a path of a continuous ion beam by securing the substrate to a platen and moving the platen such that the substrate passes in and out of the continuous ion beam.

3. The method of claim 1, wherein the temperature threshold is about 150 degrees Celsius.

4. The method of claim 1, wherein the heating temperature is within a range of about 150 to about 800 degrees Celsius.

5. The method of claim 1, wherein the first time range is between 1 and 8 seconds, and wherein the second time range is between 2 and 5 seconds.

6. The method of claim 1, wherein the annealing temperature is greater than 950 degrees Celsius.

7. The method of claim 1, wherein the implantation process is to form a lightly doped region on the feature.

8. The method of claim 1, wherein a dosage of the ion beam is less than about $5 \times 10^{-14}$.

9. The method of claim 1, wherein the ion beam has a current within a range of about 6 to about 13 milliamps.

10. The method of claim 1, wherein the specified temperature range is about 150 to about 800 degrees Celsius.

11. The method of claim 1, wherein the second time range has a different duration than the first time range.

12. The method of claim 1, wherein the first time range has a first duration and the second time range has a second duration, and wherein the first duration is greater than the second duration.

13. The method of claim 2, wherein moving the platen comprises:

tilting the platen to a first angle such that the ion beam is directed to the substrate; and tilting the platen to another angle such that the ion beam is directed away from the substrate.

14. A method comprising:

providing a semiconductor substrate;

epitaxially growing semiconductor structures onto the semiconductor substrate;

forming lightly doped regions within the semiconductor structures by applying an ion implantation process comprising:

applying an ion beam to the surface during a first time range;

not applying the ion beam to the surface during a second time range, the second time range consecutive to the first time range;

applying the ion beam to the surface during a third time range, the third time range consecutive to the second time range;

not applying the ion beam to the surface during a fourth time range, the fourth time range consecutive to the third time range;

while applying the ion implantation process, continuously heating the substrate to be within a specified temperature range; and after applying the ion implantation process, applying a spike annealing process to the substrate.

15. The method of claim 14, wherein applying the ion implantation process further comprises:

securing the substrate to a platen; and moving the platen by tilting the platen such that the substrate passes in and out of a path of a continuous ion beam.

16. The method of claim 14, wherein the semiconductor structures comprise fin structures.

17. The method of claim 14, wherein the annealing temperature is about 950 degrees Celsius.

18. A semiconductor fabrication system comprising:

a platen for securing a substrate;

an ion source configured to project an ion beam;

a heating source to heat the substrate to a temperature greater than a threshold temperature; and a control system configured to:

intermittently apply the ion beam to a surface of the substrate, the intermittently applying the ion beam comprising:

applying an ion beam to the surface during a first time range;

not applying the ion beam to the surface during a second time range, the second time range consecutive to the first time range;

applying the ion beam to the surface during a third time range, the third time range consecutive to the second time range;

not applying the ion beam to the surface during a fourth time range, the fourth time range consecutive to the third time range;

while intermittently applying the ion beam, use the heating source to apply a heating process with a heating temperature above the threshold temperature; and after intermittently applying the ion beam, performing an annealing spike process to the substrate.

19. The system of claim 18, wherein the threshold temperature is about 150 degrees Celsius.

20. The system of claim 18, wherein the annealing temperature is greater than about 950 degrees Celsius.

* * * * *